(12) United States Patent
Lin et al.

(10) Patent No.: US 8,887,386 B2
(45) Date of Patent: Nov. 18, 2014

(54) METHOD OF MANUFACTURING A CHIP SUPPORT BOARD STRUCTURE

(71) Applicant: Kinsus Interconnect Technology Corp., Taoyuan (TW)

(72) Inventors: Ting-Hao Lin, Taipei (TW); Yu-Te Lu, Taoyuan Hsien (TW); De-Hao Lu, Taoyuan County (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 192 days.

(21) Appl. No.: 13/663,333

(22) Filed: Oct. 29, 2012

(65) Prior Publication Data

US 2014/0115888 A1    May 1, 2014

(51) Int. Cl.
  *H05K 3/02*    (2006.01)
(52) U.S. Cl.
  USPC ............... 29/847; 29/825; 29/827; 29/829; 29/846
(58) Field of Classification Search
  USPC ........... 29/847, 825, 827, 829, 846, 852, 879; 228/155, 159, 179.1, 180.22, 180.5, 228/199; 428/121, 209, 212, 473.5, 901
  See application file for complete search history.

(56) References Cited

U.S. PATENT DOCUMENTS 5,374,469 A * 12/1994 Hino et al. ............... 428/209
2013/0181344 A1 * 7/2013 Yanase et al. ............ 257/737

* cited by examiner

*Primary Examiner* — Thiem Phan
(74) *Attorney, Agent, or Firm* — Lin & Associates IP, Inc.

(57) ABSTRACT

A method of manufacturing a chip support board structure which includes the steps of forming a metal substrate structure, forming a photo resist pattern, etching the metal substrate structure to form a paddle, removing the photo resist pattern, pressing an insulation layer against the paddle, polishing the insulation layer, forming a circuit layer and forming a solder resist is disclosed. The metal substrate structure is formed by sandwiching a block layer with two metal substrate layers, multilayer. The metal substrate structure is etched under control to an effective depth such that each paddle thus formed has the same shape and depth. Therefore, the method of the present invention can be widely applied to the general mass production processes to effectively solve the problems in the prior arts due to depth differences, such offset, position mismatch and peeling off in the chip support board.

6 Claims, 9 Drawing Sheets

METHOD OF MANUFACTURING A CHIP SUPPORT BOARD STRUCTURE

BACKGROUND OF THE INVENTION

1. Field of the Invention

The present invention generally relates to a method of manufacturing a chip support board structure, and more specifically to forming a block layer on a metal substrate to maintain a paddle with high stability and further avoid the problem of easily peeling off.

2. The Prior Arts

Please refer to FIGS. 1A and 1B for illustrating the first and second examples of the chip support board in the prior arts, respectively. The chip support board 100 shown in FIG. 1A generally comprises a metal substrate 10, a paddle 15 on the metal substrate 10, an insulation layer 30, a circuit layer 40 and a solder resist 60. The insulation layer 30 fills up the space between the paddle 15 and the metal substrate 10, but one surface of the paddle 15 is exposed from the insulation layer 30 such that the surface of the paddle 15 and the insulation layer 30 form a co-plane surface. The circuit layer 40 is formed on the co-plane surface and is connected with the paddle 15. The solder resist 60 is formed on the insulation layer 30 and the circuit layer 40 to cover part of the circuit layer 40 so as to avoid short circuit upon forming the bonding pads (not shown).

As shown in FIG. 1B, the chip support board 150 in the prior arts is varied with respect to the above chip support board 100 by a carbon fiber prepreg cloth 50 embedded in the insulation layer 30 and a conductive layer 55 formed on the carbon fiber prepreg cloth 50. The circuit layer 40 is formed on the co-plane surface which is formed by the paddle 15, the insulation layer 30 and the conductive layer 55 so as to connect with the paddle 15 and the conductive layer 55.

However, one of the shortcomings of the chip support board in the prior arts is that the paddle 15 is generally formed by the itching process on the circuit layer 40, that is, directly formed of the circuit layer 40. It is difficult to maintain the shape, the etching depth and the void depth of the paddle 15 in the mass production because of the same material. This leads to failure of maintaining a smooth surface, and therefore, it is hard to maintain constant the location of the carbon fiber prepreg cloth 50 and the conductive layer 55 formed on the carbon fiber prepreg cloth 50. Additionally, the board is easily peeled off due to external force, thereby affecting the yield rate of the board.

SUMMARY OF THE INVENTION

A primary objective of the present invention is to provide a method of manufacturing a chip support board structure, which comprises the steps of: forming a metal substrate structure by sequentially performing a deposition process and a pressing process, wherein the deposition process deposits a block layer on an lower metal substrate and the pressing process presses an upper metal substrate against the block layer on the lower metal substrate such that the metal substrate structure with a multilayer structure is formed; forming a photo resist pattern on the upper metal substrate; using an etching agent to etch part of the upper metal substrate not masked by the photo resist pattern so as to form a paddle, wherein the etching agent does not react with the block layer; removing the photo resist pattern; pressing an insulation layer against the paddle such that the insulation layer fills up a space between the block layer and the paddle; polishing the insulation layer to flatten an upper surface of the insulation layer and expose an upper surface of the paddle such that the upper surface of the paddle and the upper surface of the insulation layer form a co-plane surface; forming a circuit layer on the co-plane surface by an image transfer process, wherein the circuit layer covers part of the upper surface of the insulation layer and part of the upper surface of the paddle so as to connect with the paddle; and forming a solder resist on the co-plane surface, wherein the solder resist covers part of the insulation layer and part of the paddle which are not covered by the circuit layer, and part of the circuit layer.

One aspect of the present invention is that the etching depth is precisely controlled in the wet etching process by the block layer such that each paddle has the same shape and depth. Therefore, the method of the present invention can be widely applied to the general mass production processes to effectively solve the problems in the prior arts due to depth differences, such offset, position mismatch and peeling off in the chip support board.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1A:
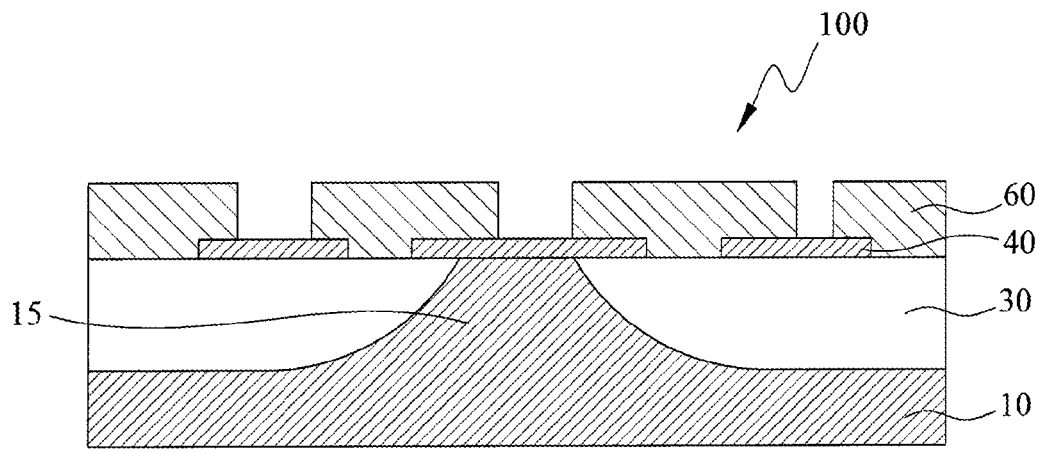
FIG. 1A schematically shows a diagram to illustrate the first example of the chip support board in the prior arts.
Figure 1B:
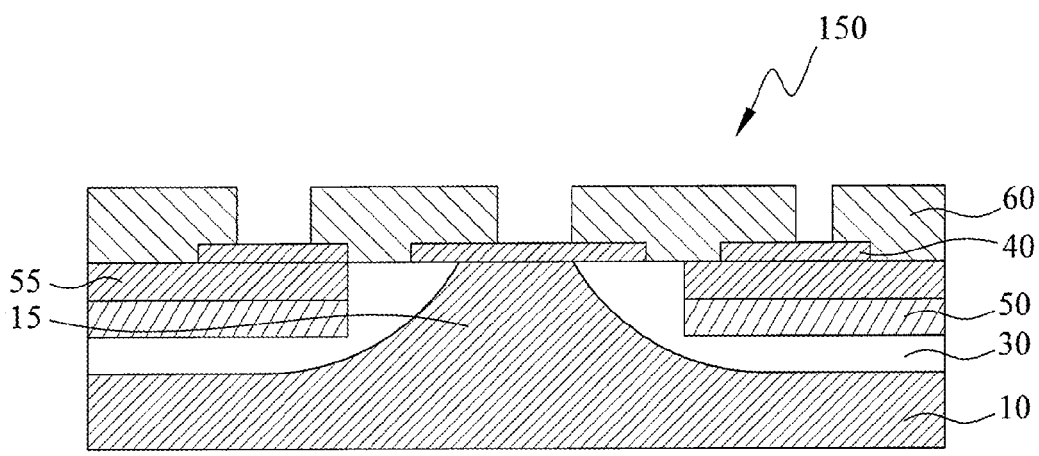
FIG. 1B shows a diagram to illustrate the second example of the chip support board in the prior arts.
Figure 2:
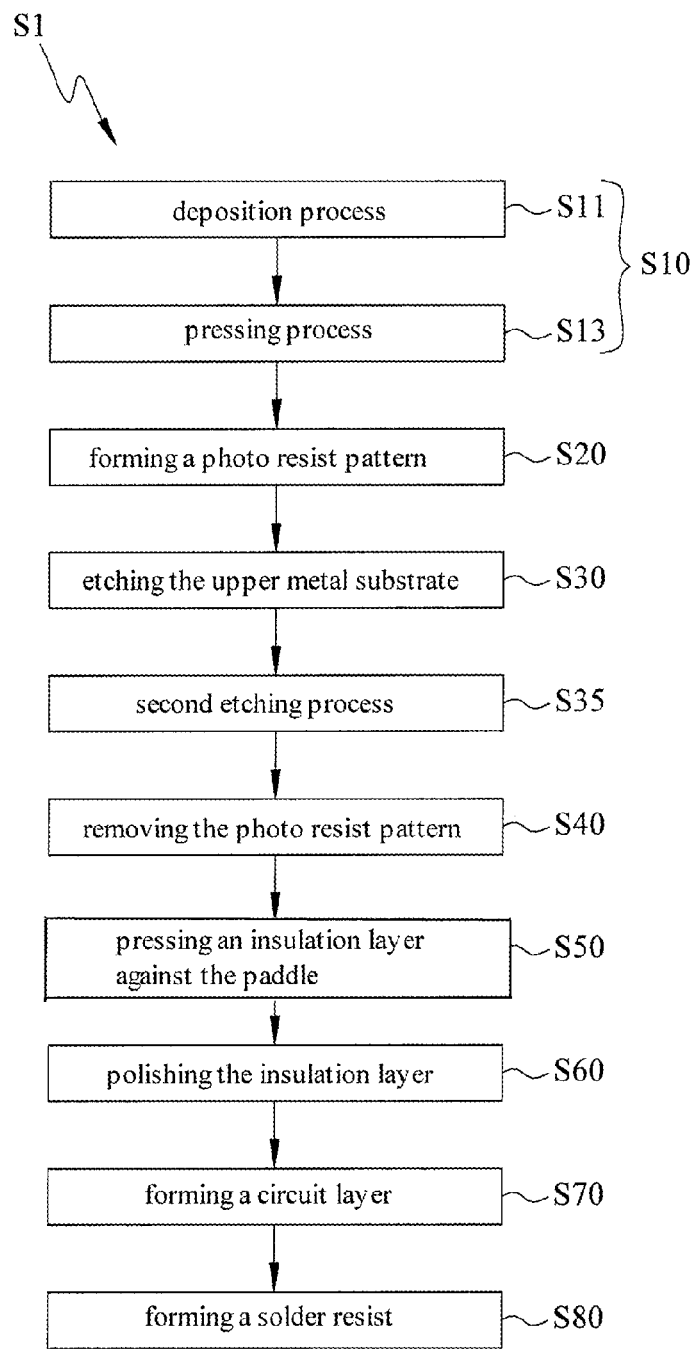
FIG. 2 shows a flow diagram of the method manufacturing a chip support board structure according to the present invention.

Please refer to FIGS. 2, 3A to 3I, 4A and 4B, and 5A to 5C for illustrating the corresponding schematic diagrams of the processes in the method according to the present invention. As shown in FIG. 2, the method manufacturing a chip support board structure according to the present invention comprises the steps of forming a metal substrate structure S10, forming a photo resist pattern S20, etching the upper metal substrate S30, removing the photo resist pattern S40, pressing an insulation layer against the paddle S50, polishing the insulation layer S60, forming a circuit layer S70 and forming a solder resist S80.

Figure 3A:
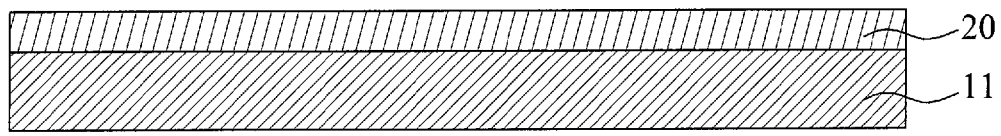
FIGS. 3A to 3I, 4A and 4B and 5A to 5C show the corresponding schematic diagrams of the processes in the method according to the present invention.
Figure 3B:
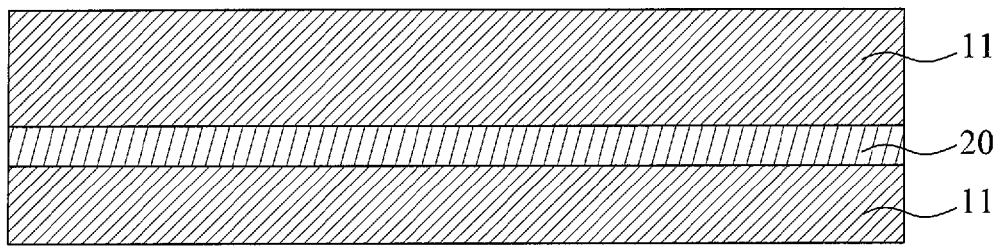
Figure 3C:
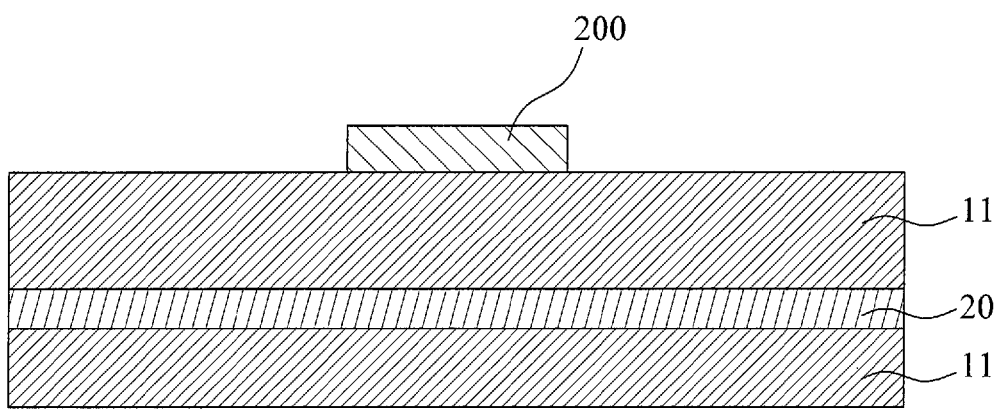
Figure 3D:
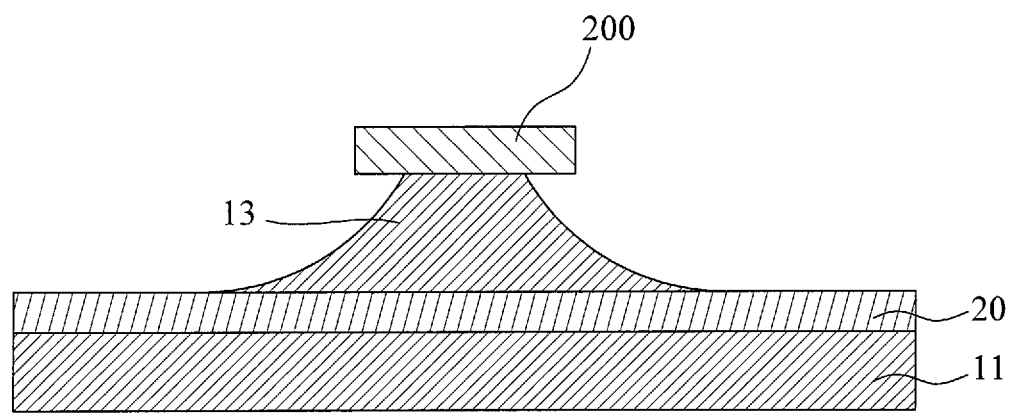
Figure 3E:
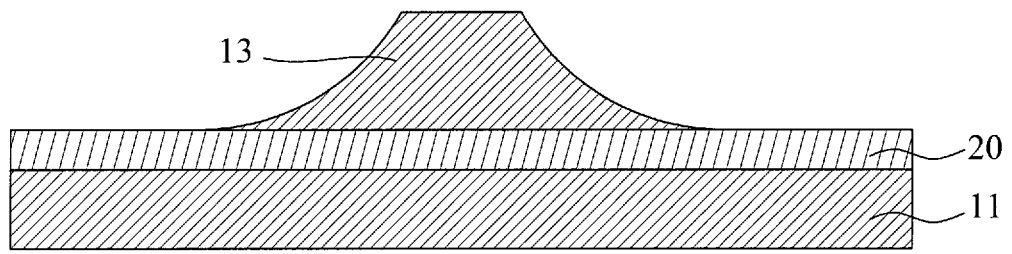

Refer to FIGS. 2, and 3A to 3I. The step S10 further comprises two processes performed sequentially, including a deposition process S11 and a pressing process S13. The step S11 forms a block layer 20 on a metal substrate layer 11 as a lower metal substrate layer, and the step S13 presses another metal substrate 11 as an upper metal substrate against the block layer 20 on the lower metal substrate such that the metal substrate structure with a multilayer structure is formed. Then in FIG. 3C, the step S20 forms a photo resist pattern 200 on the upper metal layer 11. The step S30 as shown in FIG. 3D removes part of the upper metal layer 11 not covered by the photo resist pattern 200 by using an etching agent. Owing to the characteristics of the wet etching process, a paddle 13 is formed on the upper metal layer 11. The step S30 stops at the block layer 20 because the etching agent does not react with the block layer 20. Next in FIG. 3E, the step 40 removes the photo resist pattern 200 on the paddle 13.

Figure 3F:
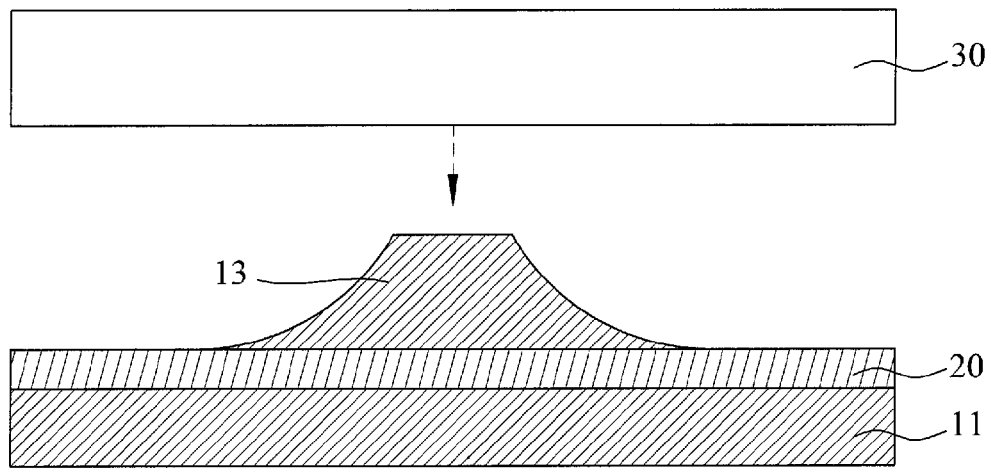
Figure 3G:
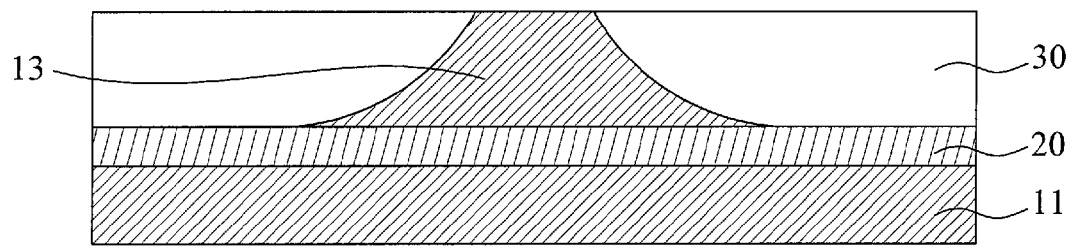
Figure 3H:
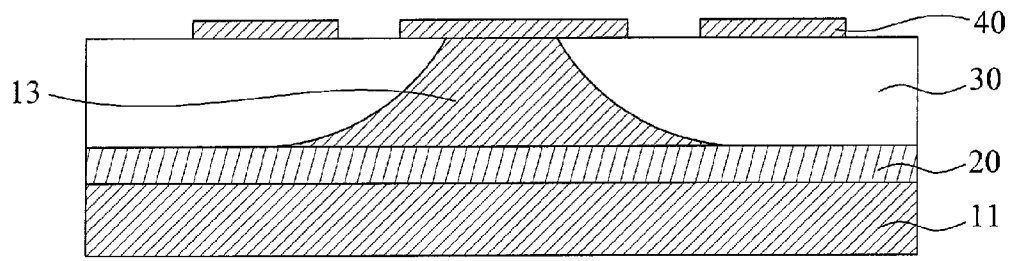
Figure 3I:
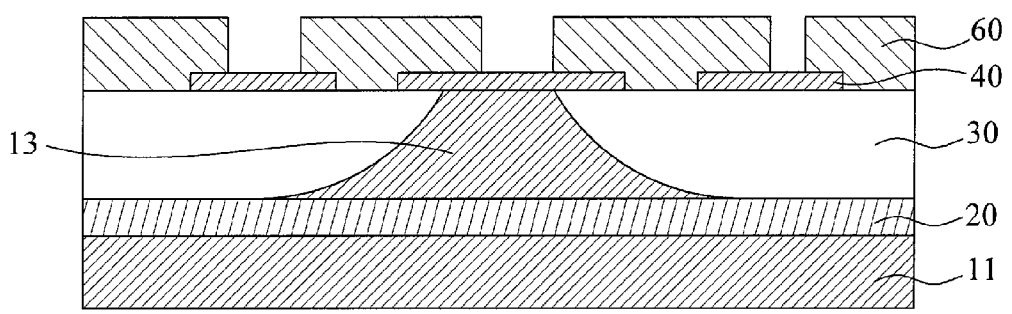

As shown in FIG. 3F, the step S50 presses the insulation layer 30 against the paddle 13 such that the insulation layer 30 fills up the space between the block layer 20 and the paddle 13. The step 60 shown in FIG. 3G flattens the upper surface of the insulation layer 30 and meanwhile exposes the upper surface of the paddle 13 such that the upper surface of the paddle 13 and the upper surface of the insulation layer 30 form a co-plane surface. As shown in FIG. 3H, the step S70 forms the circuit layer 40 on the co-plane surface, which covers part of the insulation layer 30 and part of the paddle 13. The circuit layer 40 thus connects with the paddle 13. Finally, the step S80 shown in FIG. 3I forms the solder resist 60 on the co-plane surface. The solder resist 60 covers part of the circuit layer 40, part of the insulation layer 30 and part of the paddle 13 which are not covered by the circuit layer 40 to avoid the problem of short circuit upon forming the bonding pads (not shown).

Figure 4A:
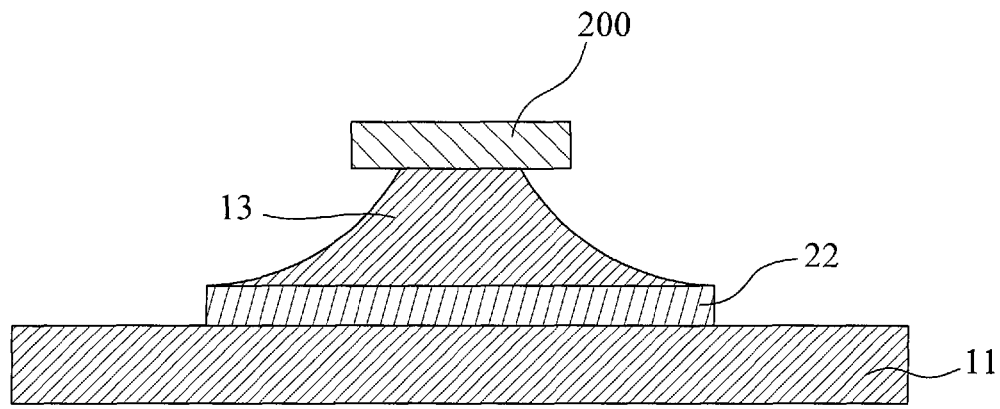
Figure 4B:
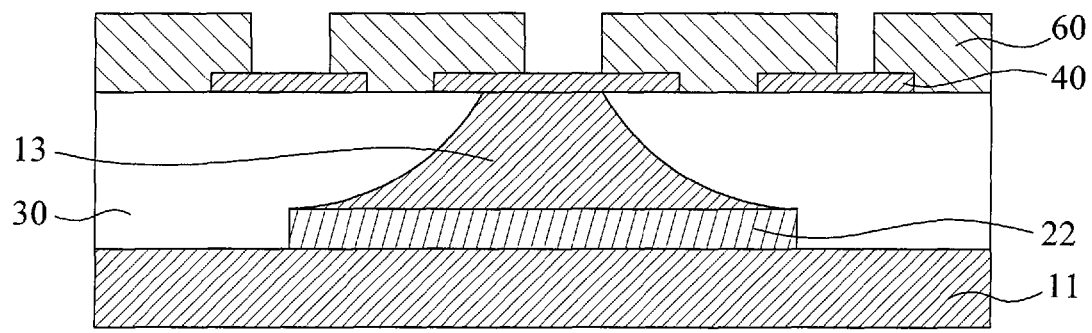

Moreover, as shown in FIGS. 2 and 4A, the second etching process S35 is performed after the step S30 to etch part of the block layer 20 not masked by the paddle 13 by using another etching agent, and the block 22 in FIG. 4A is thus formed. The another etching agent dos not react with the lower metal substrate 11, and therefore, the second etching process S35 stops at the lower metal substrate 11. Then, the Steps S40, S50, S60, S70 and S80 are sequentially performed to form the structure in FIG. 4B, wherein the insulation layer 30 fills up the space among the block layer 22, the lower metal substrate 11 and the paddle 13.

Figure 5A:
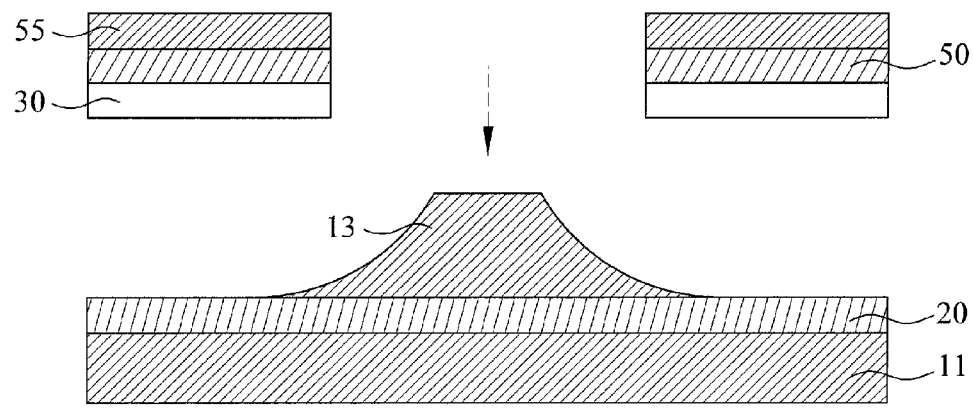

Further, as shown in FIG. 5A, the step S50 simultaneously presses at least one carbon fiber prepreg cloth 50 on which at least one conductive layer 55 provided as the insulation layer 30 pressed against the paddle 13. The insulation layer 30 fills up the space between the block layer 20 and the paddle 13. Therefore, the at least one carbon fiber prepreg cloth 50 and the at least one conductive layer 55 on the carbon fiber prepreg cloth 50 are embedded in the insulation layer 30.

Figure 5B:
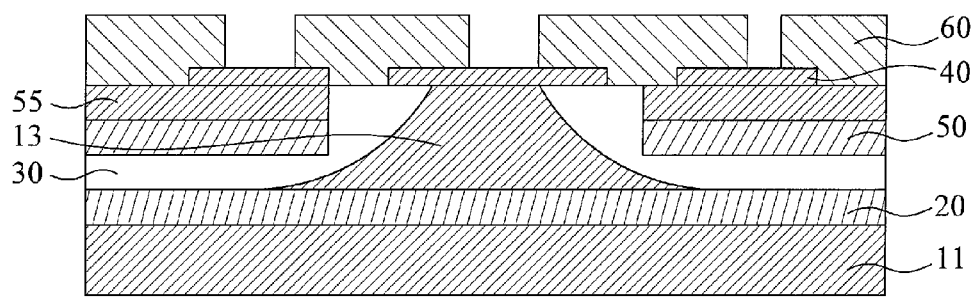
Figure 5C:
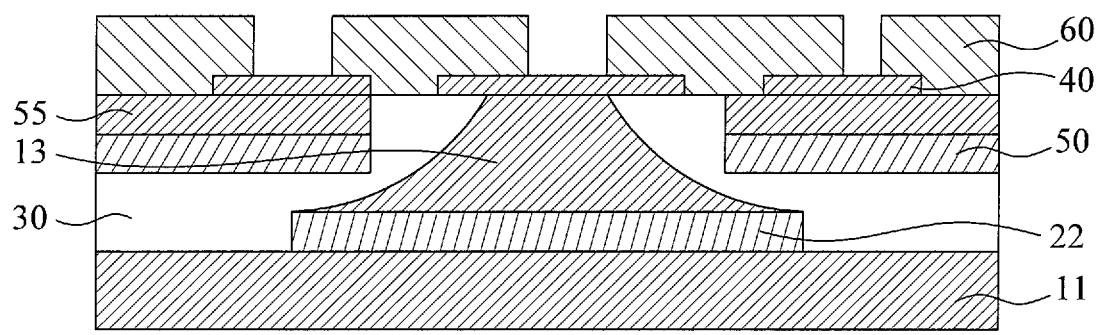

The step S60 is performed to expose the at least one conductive layer 55 and the paddle 13 such that the upper surface of the insulation layer 30, the upper surface of the at least one conductive layer 55 and the upper surface of the paddle 13 are coplanar on the co-plane surface. Next, the step S70 forms the structure as shown in FIG. 5B, wherein the circuit layer 40 is formed on the co-plane surface formed by the upper surface of the paddle 13, the upper surface of the at least one conductive layer 55 and the upper surface of the insulation layer 30 so as to cover part of the paddle 13, part of the at least one conductive layer 55 and part of the insulation layer 30. Finally, in the step S80, the solder resist 60 is formed to cover part of the circuit layer 40, part of the insulation layer 30, part of the paddle 13 and part of the conductive layer 55 which are not covered by the circuit layer 40. Additionally, the structure in FIG. 5C is formed if the second etching process S35 is performed.

The metal substrate 11, the paddle 13 and the circuit layer 40 are made of at least one of copper and aluminum. The block layer 20, 22 is made of at least one of tin, nickel, titanium and palladium which further forms an intermetallic compound with the material forming the metal substrate 11. The block layer 20, 22 has a thickness between 3~10 and the insulation layer 30 is made of one of a BT resin, a glass fiber, an ABF (Ajinomoto Build-Up Film) film.

One aspect of the present invention is that the etching depth is precisely controlled in the wet etching process by the block layer such that each paddle has the same shape and depth. Therefore, the method of the present invention can be widely applied to the general mass production processes to effectively solve the problems in the prior arts due to depth differences, such offset, position mismatch and peeling off in the chip support board.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of manufacturing a chip support board structure, comprising steps of:

forming a metal substrate structure by sequentially performing a deposition process and a pressing process, wherein the deposition process deposits a block layer on an lower metal substrate and the pressing process presses an upper metal substrate against the block layer on the lower metal substrate such that the metal substrate structure with a multilayer structure is formed;

forming a photo resist pattern on the upper metal substrate;

using an etching agent to etch part of the upper metal substrate not masked by the photo resist pattern so as to form a paddle, wherein the etching agent does not react with the block layer;

removing the photo resist pattern;

pressing an insulation layer against the paddle such that the insulation layer fills up a space between the block layer and the paddle;

polishing the insulation layer to flatten an upper surface of the insulation layer and expose an upper surface of the paddle such that the upper surface of the paddle and the upper surface of the insulation layer form a co-plane surface;

forming a circuit layer on the co-plane surface by an image transfer process, wherein the circuit layer covers part of the upper surface of the insulation layer and part of the upper surface of the paddle so as to connect with the paddle; and forming a solder resist on the co-plane surface, wherein the solder resist covers part of the insulation layer and part of the paddle which are not covered by the circuit layer, and part of the circuit layer.

2. The method as claimed in claim 1, wherein the pressing the insulation layer against the paddle further simultaneously presses at least one carbon fiber prepreg cloth on which at least one conductive layer is provided such that the at least one carbon fiber prepreg and the at least one conductive layer are embedded in the insulation layer, the polishing the insulation layer exposes an upper surface of the at least one conductive layer and the upper surface of the paddle such that the upper surface of the insulation layer, the upper surface of the at least one conductive layer and the upper surface of the paddle are coplanar on the co-plane surface, the circuit layer covers part of the paddle, part of the at least one conductive layer and part of the insulation layer, the solder resist covers the insulation layer, the paddle and the conductive layer not covered by the circuit layer, and part of the circuit layer.

3. The method as claimed in claim 2, further comprising a second etching process after etching the upper metal substrate, wherein the second etching process uses a second etching agent to remove part of the block layer not masked by the paddle, the second etching agent does not react with the upper metal substrate and the paddle, and the insulation layer fills up the space between the upper metal substrate and the paddle while the insulation layer is pressed against the paddle.

4. The method as claimed in claim 2, wherein the at least one conductive layer is made of at least one of copper and aluminum.

5. The method as claimed in claim 1, further comprising a second etching process after etching the upper metal substrate, wherein the second etching process uses a second etching agent to remove part of the block layer not masked by the paddle, the second etching agent does not react with the upper metal substrate and the paddle, and the insulation layer fills up the space between the upper metal substrate and the paddle while the insulation layer is pressed against the paddle.

6. The method as claimed in claim 1, wherein the lower metal substrate, the upper metal substrate, the paddle and the circuit layer are formed of at least one of copper and aluminum, the block layer is formed of at least one of tin, nickel, titanium and palladium which forms an intermetallic compound with the lower and upper metal substrates, the block layer has a thickness within 3~10 μm, and the insulation layer is made of one of a BT resin, a glass fiber, an ABF (Ajinomoto Build-Up Film) film.

\* \* \* \* \*